United States Patent [19]

Lokhoff

[11] Patent Number: 5,434,862
[45] Date of Patent: Jul. 18, 1995

[54] MULTISTATION COMMUNICATION BUS SYSTEM, AND A MASTER STATION AND A SLAVE STATION FOR USE IN SUCH SYSTEM

[75] Inventor: Gerardus C. P. Lokhoff, Eindhoven, Netherlands

[73] Assignee: U.S. Philips Corporation, New York, N.Y.

[21] Appl. No.: 105,214

[22] Filed: Aug. 10, 1993

[30] Foreign Application Priority Data

Aug. 12, 1992 [EP] European Pat. Off. ............ 92202485

[51] Int. Cl.⁶ .......................................... H04L 12/403
[52] U.S. Cl. ..................... 370/85.11; 340/825.07
[58] Field of Search .................. 370/85.1, 85.9, 85.11, 370/85.15; 340/825.06, 825.05, 825.07, 825.5, 825.57

[56] References Cited

U.S. PATENT DOCUMENTS

| | | | |
|---|---|---|---|
| 3,601,543 | 3/1970 | Maniere et al. | 370/85.11 |
| 3,993,870 | 11/1976 | Schwartz | 370/85.11 |
| 4,242,749 | 12/1980 | Takezoe | 370/85.11 |
| 4,426,697 | 1/1984 | Petersen et al. | 370/85.11 |
| 4,669,079 | 5/1987 | Blum | 370/85.11 |
| 4,683,530 | 7/1987 | Quatse | 364/200 |

FOREIGN PATENT DOCUMENTS 0159941 4/1984 European Pat. Off. ...... G06F 13/42

OTHER PUBLICATIONS

Naufel, "Serial Techniques Expand Your Options For μC Peripherals", EDN, Feb. 18, 1988, pp. 199–204.
Meusburger, "1.5 V 1 K-CMOS-RAM with Only 8 Pins", IEEE Journal of Solid State Circuits, vol. SC-16, No. 3, Jun. 1981, pp. 190–194.

*Primary Examiner*—Wellington Chin
*Attorney, Agent, or Firm*—Anne E. Barschall

[57] ABSTRACT

A multistation communication system accommodates one master station and a plurality of slave stations. The bus has a separate clock signal wire, a separate information bit group wire, and a separate indication signal wire. A first value of the indication signal identifies an actual information bit group as an address, a second value identifies them as data. Each address bit group has control bits next to operational address bits. A slave station may recognize one or more addresses as its own address; the associated control bits will then mandate the transfer direction. Furthermore, the slave station may recognize one particular operational address as an interface reset control signal.

13 Claims, 3 Drawing Sheets

MULTISTATION COMMUNICATION BUS SYSTEM, AND A MASTER STATION AND A SLAVE STATION FOR USE IN SUCH SYSTEM

FIELD OF THE INVENTION

The invention relates to a multistation communication bus system accommodating one master station and a plurality of slave stations, said master station being arranged for separately transmitting clock signals, information bit group signals, and indication signals on respective separate wires, each indication signal identifying an actual information bit group as representing either address information or data information. Such a system has been described in "Serial techniques expand your options for microC peripherals" by Mr. Naji Naufel, EDN Feb. 18, 1988 p. 199–204, in particular FIG. 4, referring to the IDENT line of the Intermetall line of peripherals. FIG. 2 of the same article, however, states that these same peripherals need part of a parallel port for control purposes. There is a growing need for narrow serial bus systems to communicate with peripherals that, although having sophisticated internal functionality, are less versatile viz à viz a remote master station.

SUMMARY OF THE INVENTION

Accordingly, amongst other things, it is an object of the present invention to provide a system of this kind that provides a straightforward communication protocol, and wherein in particular the message format should be short, as calculated in the number of bytes, whilst allowing for bidirectional transfer, and also for a limited set of control operations, inclusive of reset of the peripheral bus interface. Now, according to one of its aspects, the invention is characterized in that such address information bit group also comprises control bits next to operational address bits, said slave stations each being arranged for recognizing:
- at least one particular respective address as their own address,
- respective values of said control bits as mandating a subsequent data transfer direction with respect tot an addressed slave, and
- one particular operational address as an interface reset control signal.

A particular advantage of this technology is that transition between an address bit group and a data bit group can be detected without recourse to a bit counter. An additional advantage of resetting the interface the bus is that the bus thereupon is freed from the above protocol, whereby execution of a different and incompatible protocol becomes feasible. The invention also relates to a master station for use in such system and to a slave unit for use in such system.

Advantageously, said address bit group comprises a system address bit subgroup as distinct from a device address bit subgroup. This allows easy definition of the various peripheral/slave station addresses in a multimanufacturer environment.

Advantageously, said master station is arranged for driving said indication signal to the address identifying value for signalling a "halt" mode. This is a straightforward signal organization for making it clear to any slave station that the master station will refrain from communication for the time being.

Advantageously, said system is provided for executing an address programming mode through transfer of a secondary address identification code. The same organization as provided for the standard communication may with a slight extension be used for such address programming.

Advantageously, said system is arranged for through said interface reset control signal freeing said bus for thereby accommodating execution of a different and incompatible bus protocol. Especially in a multimanufacturer environment, various other, non-conforming bus protocols may be implemented. Now, these various protocol definitions may share their respective hardware transfer media for so lowering costs.

In particular, the invention relates to a master station having first bus wire attachment means for outputting clock signals, second bus wire attachment means for communicating information bit group signals, and third bus wire attachment means for outputting indication signals, each indication signal identifying an actual information bit group as representing either address information or data information, characterized in that said second bus wire attachment means are arranged to output a plurality of different addresses inclusive of at least one operational address bit as an interface reset control signal, and in that said second bus wire attachment means are arranged for within an address bit group inserting at least two control bits for with respective values thereof mandating a subsequent data transfer direction with respect to an addressed slave. At a moderate cost level, this allows for high transfer speed at appropriate flexibility.

In particular, the invention relates to a slave station having fourth bus wire attachment means for receiving said clock signals, fifth bus wire attachment means for communicating information bit group signals, and sixth bus wire attachment means for receiving indication signals and through the value of such indication signal discriminating an actual bit group received as representing either address information or data information, said fifth bus wire attachment means being responsive to said discriminating for when address information being arranged to:
- recognizing at least one particular respective address as its own address;
- within an address information representing bit group recognizing respective values of non-address control bits as mandating a subsequent data transfer direction with respect said fifth bus wire attachment means. In mirroring the master station's features, the slave station is inexpensive and adequate and extremely useful in low-level devices such as consumer electronics for audio/video entertainment, especially, with an eye on low cost.

Various advantageous aspects are recited in dependent Claims.

BRIEF DESCRIPTION OF THE DRAWINGS

These and other advantages will be explained more in detail with respect to the Figures that show a preferred embodiment, and in particular
- FIG. 1 a system according to the invention.

DETAILED DESCRIPTION OF A PREFERRED EMBODIMENT

The main purpose of the new interface definition is to define a protocol that allows for the transfer of control information and operational details between a microcontroller ($\mu C$) and a number of slave devices, at a rate that exceeds other common interfaces, but with a sufficient low complexity for application in consumer products, such as digital audio tape recorders, video recorders, high-fi audio apparatus, and others. It should be noted that the interface is intended for use in a single apparatus, preferably restricted to a single printed circuit board. The new interface requires three signal lines (apart from a return "ground") between the microcontroller and the slave devices (from this the name "L3" is derived). These three lines are common to all IC's connected to the bus: L3MODE, L3DATA and L3CLK, L3MODE and L3CLK are always driven by the microcontroller, L3DATA is bidirectional:

| signal name | microcontroller | slave device |
|---|---|---|
| L3MODE | output | input |
| L3CLK | output | input |
| L3DATA | output/input | input/output |

L3DATA will carry the information to be transferred. L3CLK is the bit clock to which the information transfer will be synchronized. L3MODE is used for the identification of the operation mode.

All slave devices in the system can be addressed using a 6 bit address. This allows for up to 63 different slave devices, because the all "0" address is reserved for special purposes. In addition it is possible to extend the number of addressable devices using "extended addressing", as explained hereinafter. In operation two modes can be identified: addressing mode (AM) and data mode (DM).

Figure 1:
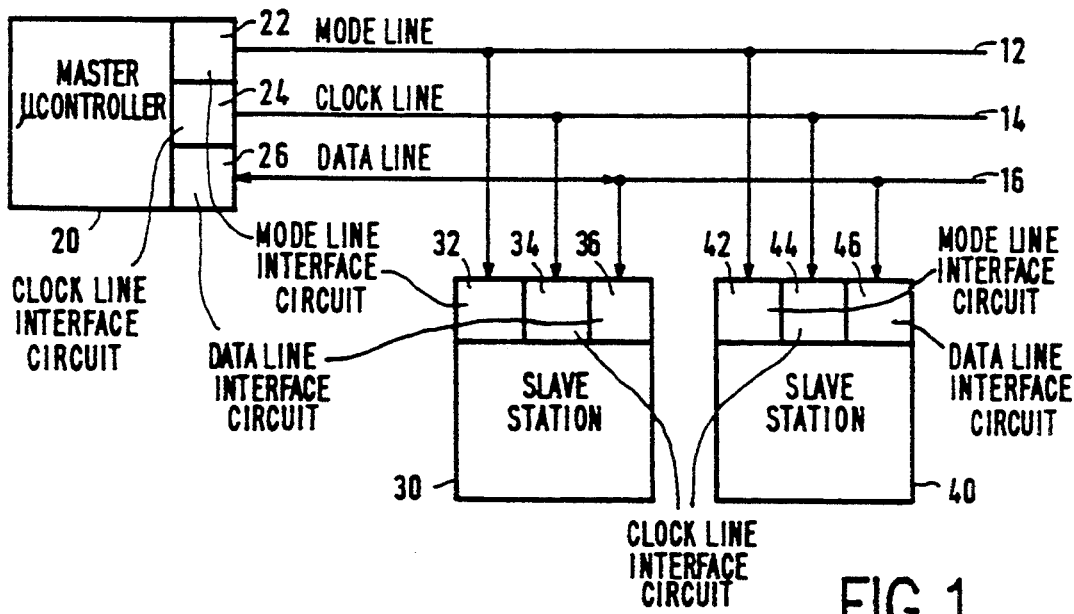

FIG. 1 is a block diagram of a communication bus system according to the invention. The bus consists of three wires 12, 14, 16 or lines, according to a nonspecified physical realization. The system has three stations, master microcontroller 20, and slave stations 30, 40. The latter may be microcontrollers as well, but generally, they are realized as special purpose blocks such as application specific integrated circuits (ASICs). Line 12 is a mode line, with mode line interface circuits 22, 32, 42 in the respective stations. Likewise, clock line 14 has clock interface circuits 24, 34, 44 and data 16 has data interface circuits 26, 36, 46. Data transfer is either from the master or towards the master, but never between two slaves. Clock and mode is always transferred from the master to one or more slaves. Construction of the interfacing circuitry is straightforward once the bus parameters have been defined. For brevity, no further details are presented here.

Figure 2:
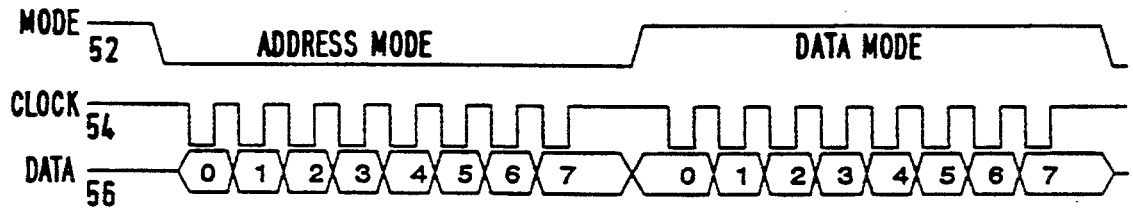
- FIG. 2 an elementry bus signal arrangement.

FIG. 2 shows various signal shapes occurring in the arrangement of FIG. 1, the shapes of the various signals have been indicated in a global manner. As regards more precise timing requirements, reference is made to FIGS. 4 to 6 hereinafter. Now trace 52 shows the mode indication bit; at left, the addressing mode prevails (mode signal low), at right, the data mode (mode signal high). If the master is not in operation with respect to the bus (it may then execute internal tasks) the mode signal is inconsequential. During addressing mode a single 8-bit byte is sent by the microcontroller (station 20 in FIG. 1). This byte consists of two leading data operation mode (DOM) bits and 6 operational address (OA) bits. Each of the slave devices evaluates the operational address. Only the device that has been issued the same operational address will become active during the following data mode. The operation to be executed during the data mode is indicated by the two data operation mode bits. If required, a slave station may recognize two or more different address contents as its "own address".

During data mode, information is transferred between microcontroller and slave device. The transfer direction may be from microcontroller to slave ("write") or from slave to microcontroller ("read"). However, during one data mode the transfer direction cannot change.

In order to start an addressing mode the microcontroller will make the mode line low. The clock line is lowered 8 times and the data line will carry 8 bits, one for each clock pulse. The addressing mode is ended by making the mode line high.

The meaning of the bits on the data line is: bits 0 & 1 are the data operation mode (DOM) bits that indicate the nature of the subsequent data transfer. Each slave device may have its own allocation of operation modes to the four possible codes of these bits. However, for new designs the preferred allocations are:

| DOM1/0 | Function | Remarks |
|---|---|---|
| 0/0 | data from $\mu C$ to IC | general purpose data transfer |
| 0/1 | data from IC to $\mu C$ | general purpose data transfer |
| 1/1 | control from $\mu C$ to IC | e.g. register selection for data transfer |
| 1/1 | status from IC to $\mu C$ | short device status message |

Bits 2 to 7 act as 6 bit operational IC address, with bit 7 as MSB and bit 2 as LSB. Bits 7, 6 and 5 act as system identification and bits 4, 3 and 2 as identification of the device within the system. The following is a list of operational addresses:

| System address OA bits 765 | System | Device address OA bits 432 | Device name | |
|---|---|---|---|---|
| 000 | General Purpose | | 000 | Special function address (see below) |
| | | | 001 | DAIO (1st selectable address) |
| | | 010 | DAIO | (2nd selectable address) |
| | | others | Reserved for future devices | |
| 001 | DCC | ... | | |
| 010 | CD | | | |
| 011 | DAB | 000 | Standard decoder | |
| | | others | Reserved for future devices | |
| 100 | | | | |
| 101 | Reserved for future systems | | | |

| System address | System | Device address | Device name |
|---|---|---|---|
| 110 | | | |
| 111 | Extending address mode | | All combinations may be used for devices with a programmable operational address |

The special function address (000000) is used for the L3 device reset, as well as for the declaration and invalidation of the extended addressing. Both will be explained herebelow.

In the data mode the microcontroller sends information to or receives information from the selected device. During data transfer the L3MODE line is HIGH. The L3CLK line is lowered 8 times during which the L3DATA line carries 8 bits. The information is presented LSB first and remains stable during the LOW phase of the L3CLK signal. The preferred basic data transfer is an 8 bit byte. Some implementations may use a basic unit of 16 bits, transferred as 2 bytes, with the most significant byte presented first.

HALT MODE

In between units the L3MODE line will be driven LOW by the microprocessor to indicate the completion of a basic unit transfer: this is called "halt mode" (HM). During halt mode the L3CLK line remains HIGH (to distinguish it from an addressing mode). The halt mode allows an implementation of an interface module without a bit counter. However, an implementation using a bit counter in the interface module may allow for the L3MODE line to be kept HIGH in between units (not using the halt mode).

Figure 3:
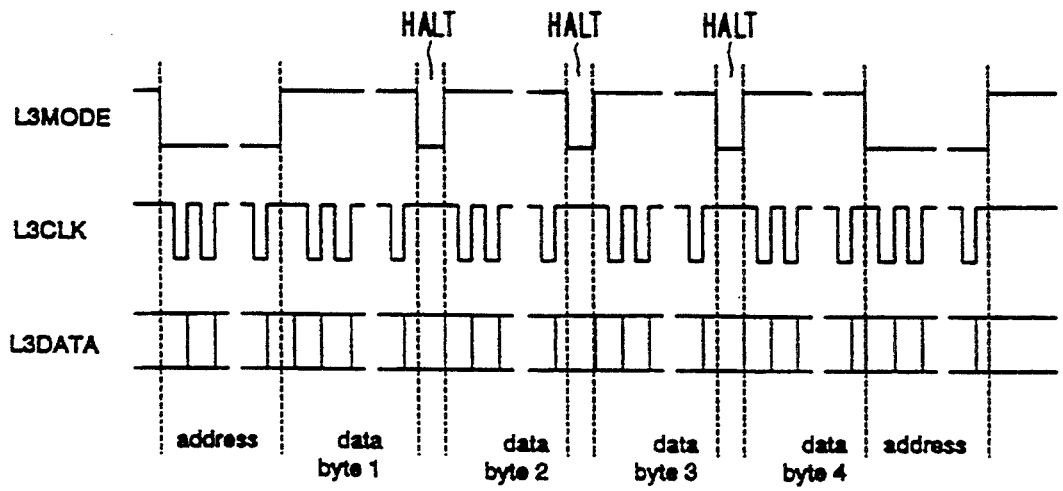
- FIG. 3 a four byte transfer diagram.

FIG. 3 shows a diagram of a four byte information transfer. First, the mode signal is low during eight clock periods, thereby allowing the transfer of two control bits and six address bits. Next, the mode signal is high during each of four sequences of eight clock pulses each. This allows for the transfer of four bytes. Between two contiguous byte transfer periods the mode signal becomes low for a short interval. This allows the slave station to reset as a countermeasure against spurious spikes, etcetera superposed on the clock that could cause paeudo data bits to be considered transferred. At the end of the transfer of the four bytes, the mode bit goes low to signal a subsequent address transfer operation. The mode bit remains low after reset, etcetera, thereby making a bit counter in the slave stations superfluous.

DEVICE INTERFACE RESET

If the microcontroller sends an operational address "000000" with DOM1 and DOM0 also equal to "0" this indicates that none of the L3 interface devices is allowed to communicate with the microcontroller during the following data mode. This enables a different application of the L3CLK and L3DATA lines as the L3 devices will not interfere with any communication on these lines as long as L3MODE remains High (e.g. the L3CLK and L3DATA lines are normally connected to USART circuits in the microcontrollers which allow for convenient communication between microcontrollers).

Any addressing mode with a valid L3 operational address will re-enable the communication with the corresponding device. Other devices with a fixed operational address ("Primary L3 devices") will then react with a device reset condition condition regardless of the state of DOM 1 and DOM0.

Devices with a programmable operational address can only be put in the interface reset condition if the DOM1 and DOM0 bits are "0". Other combinations of DOM1 and DOM0 initiate data transfers for "extended addressing".

EXTENDED ADDRESSING

L3 devices with a programmable address can be informed of their operational address using a special data transfer. For the programming of the operational address of an L3 device with a "secondary L3 identification code" the following action is required: First the microcontroller must issue an L3 operational address "000000" (special function address) with DOM1="0" and DOM0="1". This combination defines the operational address declaration operation. Next, the microcontroller will start a data transfer mode in which it first sends the secondary L3 identification code for the device that is to be issued an operational address, followed by a byte containing the operational address (the DOM bits in this byte are don't cares).

A secondary L3 identification code is unique: for any design. Special designs may have a range of identification codes, one of which can be selected by a hardware solution, to enable the connection of more than one device of the same design to the L3 interface. It is also possible to use separate L3MODE lines for multiple circuits of the same design, but the same L3 identification code (this also enables "parallel programming" of these devices). Bit 0 of any identification code byte will indicate whether or not an additional byte follows:

0—no additional byte as part of the identification code;

1—additional byte follows.

In so doing, the supplemental address information may in effect render the address length unlimited, so that the number of secondary L3 identification codes is —in theory-unlimited.

The operational address for the programmable device is preferable in the range 111000–111111. However, it is possible in a given application to issue any operational address that is not used to address primary L3 devices or other secondary L3 devices. Example: bits are shown in the order they appear on L3DATA (bit 0 first, bit 7 last).

| Addressing mode Special address | Data mode secondary L3 identification code | | | Operational address |
|---|---|---|---|---|
| | Byte 1 | Byte 2 | Byte 3 | (one byte) |

-continued

| | | | | |
|---|---|---|---|---|
| 10000000 | 1XXXXXXX | 1XXXXXXX | 0XXXXXXX | MMYYYYYY |

X = bit of the identification code;
M = DOM bit of operational address (don"t care);
Y = bit of the operational address.

OPERATIONAL ADDRESS INVALIDATION

In order to re-allocate an operational address that has been allocated to a secondary L3 device it is possible to invalidate an operational address: First the microcontroller must issue an L3 operational address "000000" (special function address) with DOM1="1" and DOM0—"0". This combination defines the operational address invalidation operation. Next the microcontroller will start a data transfer mode in which it only sends the secondary L3 identification code for the device that will no longer be addressed. From this moment on the device will not be able to communicate with the microcontroller until it is issued a new operational address by an OA (Operational Address) declaration (it will then enter a "device interface reset" condition).

A data transfer starts when the microcontroller sends an address on the bus. All IC's will evaluate this address, but only the IC addressed will be an active partner for the microcontroller in the following data transfer mode.

During the data transfer mode, bytes will be sent from or to the microcontroller. In this example the L3MODE line is made low ("halt mode") in between byte transfers. This is the default operation, although some IC's may allow the L3MODE line to be kept high.

After the data transfer the microcontroller need not send a new address until a new data transfer is necessary. Alternatively it may also send the "special address" 000000 to indicate the end of the data transfer operation.

Figure 4:
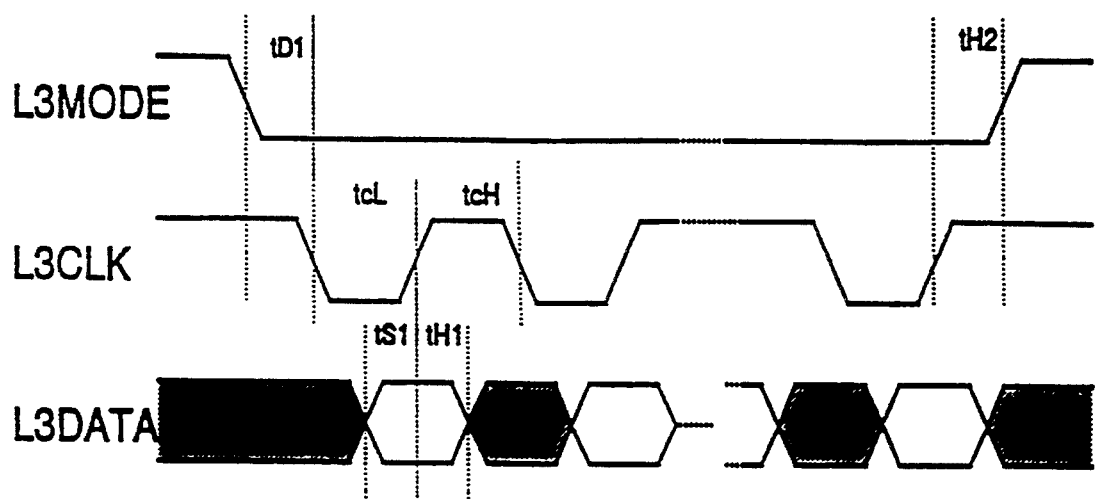
- FIG. 4 an addressing time diagram.

FIG. 4 shows an address timing diagram, with the following requirements:

| Symbol | Requirements | Description |
|---|---|---|
| tD1 | < = 190 nsec. | L3CLK H to L edge delay after L3MODE LOW |
| tcL | < = 250 nsec. | L3CLK LOW time |
| tcH | < = 250 nsec. | L3CLK HIGH time |
| tS1 | < = 190 nsec. | L3DATA setup time before L3CLK HIGH |
| tH1 | < = 30 nsec. | L3DATA hold time after L3CLK HIGH |
| tH2 | < = 190 nsec. | L3CLK hold time before L3MODE HIGH |

Figure 5:
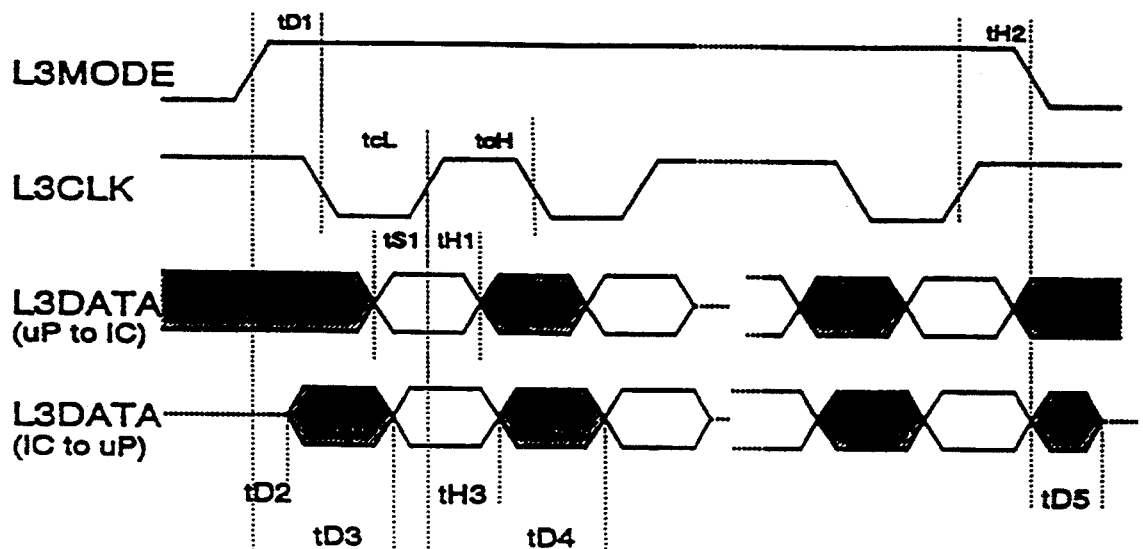
- FIG. 5 a data transfer time diagram.

FIG. 5 shows a data timing diagram, with the following requirements:

| Symbol | Requirement | Description |
|---|---|---|
| tD1 | < = 190 nsec. | L3CLK H to L edge delay after L3MODE HIGH |
| tcl | < = 250 nsec. | L3CLK LOW time |
| tcH | < = 250 nsec. | L3CLK HIGH time |
| μC to slave device: | | |
| tS1 | < = 190 nsec. | L3DATA setup time before L3CLK HIGH |
| tH1 | < = 30 nsec. | L3DATA hold time after L3CLK HIGH |
| tH2 | < = 190 nsec. | L3CLK hold time before L3MODE LOW |
| slave device to μC: | | |

-continued

| Symbol | Requirement | Description |
|---|---|---|
| tD2 | > 0, < = 50 nsec. | L3DATA enable time after L3MODE HIGH |
| tD3 | < = 380 nsec. | L3DATA stable time after L3MODE HIGH |
| tH3 | > = 50 nsec. | L3DATA hold time after L3CLK HIGH |
| tD4 | < = 360 nsec. | L3DATA stable time after L3CLK HIGH |
| tD4 | < = 530 nsec. | L3DATA stable time after L3CLK HIGH between bit 7 of a byte and bit 0 of next byte if no halt mode is used. |
| tD5 | >0, < 50 nsec. | L3DATA disable time after L3MODE LOW. |

Figure 6:
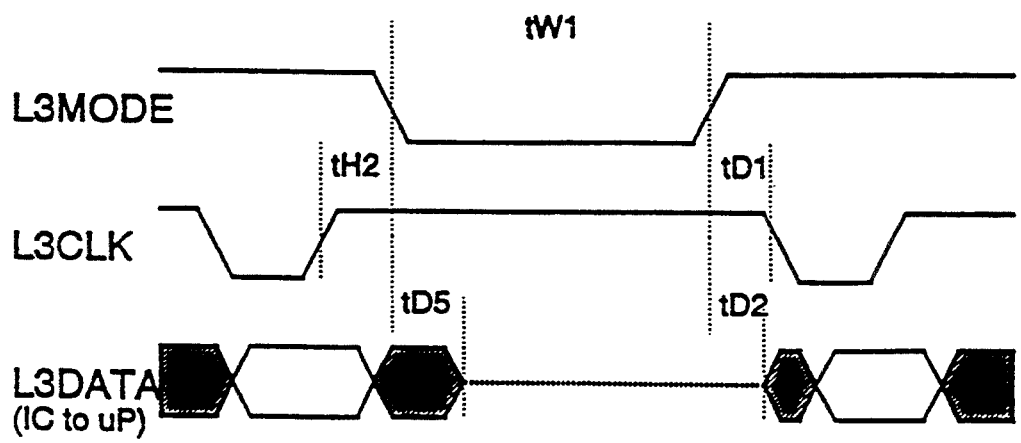
- FIG. 6 a halt mode time diagram.

FIG. 6 shows a halt mode timing diagram, with the following requirements:

| Symbol | Requirement | Description |
|---|---|---|
| tW1 | < = 190 nsec. | L3MODE LOW time |
| tD1 | < = 190 nsec. | L3CLK H to L edge delay after L3MODE HIGH |
| tH2 | < = 190 nsec. | L3CLK hold time before L3MODE LOW |
| slave device to μC: | | |
| tD2 | > 0, < = 50 nsec. | L3DATA enable time after L3MODE HIGH |
| tD5 | > 0, < = 50 nsec. | L3DATA disable time after L3MODE LOW |

Figure 7:
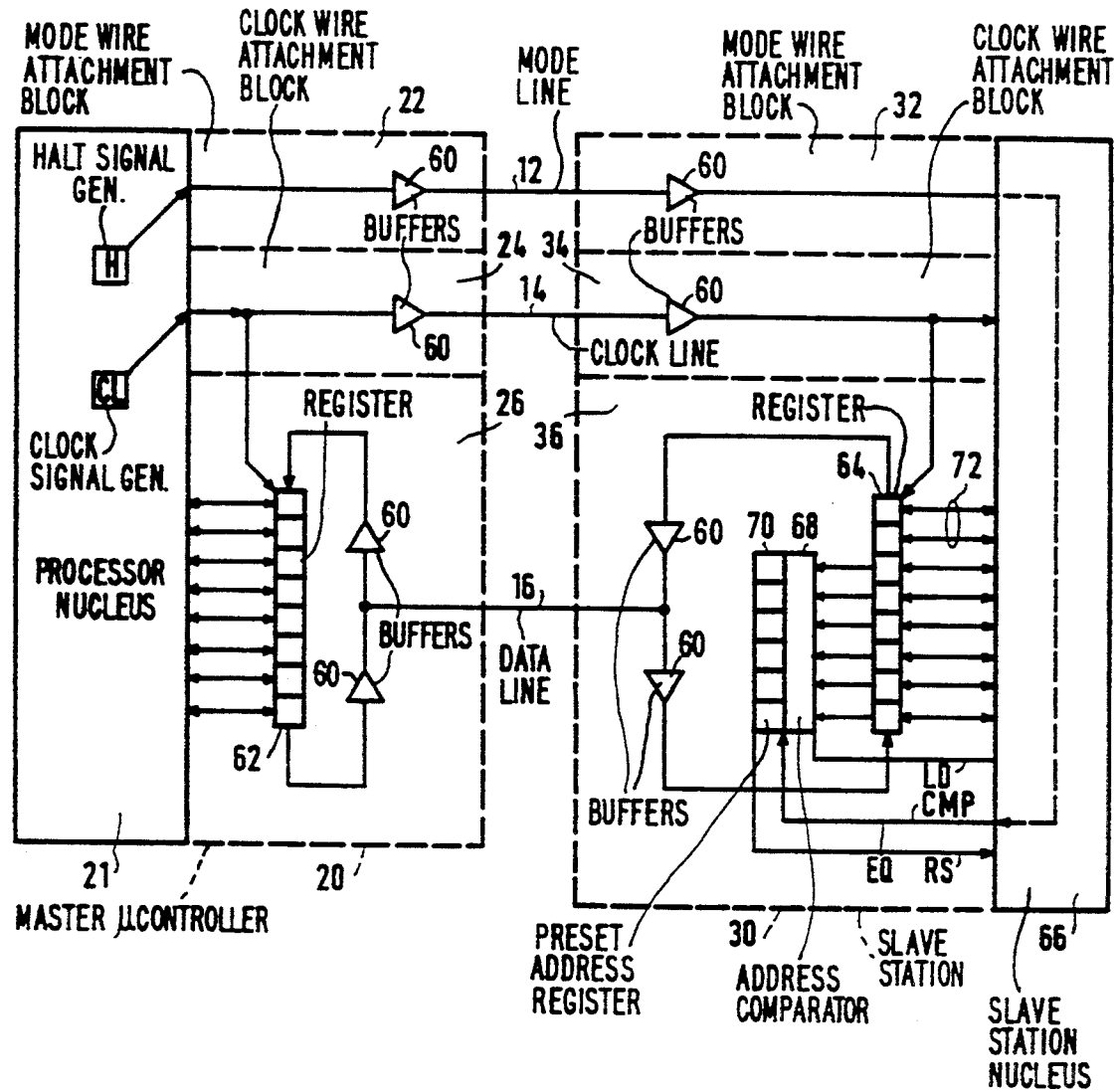
- FIG. 7 a diagrammatic interactivity between subsystems in master station and slave station.

FIG. 7 shows the diagrammatic interactivity between various subsystems in master station and slave station. Various reference numerals corresponding to those in FIG. 1. In master station 20 there is a processor nucleus 21, a clock generator CI, a halt signal generator H. The clock mode and information lines have been buffered both in the master station and in the slave station, such as by element 60. The information line has been buffered bidirectionally, and the transfer direction is controlled through selective driving of the buffers from the local stations nucleus along control lines not shown. The master station's attachment to the information wire comprises register 62 (8 bits) that features both parallel and serial I/O and as regards serial transfer is clocked by clock wire attachment block 24. The slave station comprises a similar 8-bit register 64 that communicates with slave station nucleus 66. Furthermore, address comparator 68 and preset address register 70 are activated through a "compare" signal CMP that is derived from the mode signal (at the end of the addressing mode) and through a load signal LD from the nucleus for loading a new address if applicable. Upon equality, signal EQ to the nucleus indicates that the next byte space is intended to transfer of an information bit group, the two control bits (72) indicating the transfer direction. During the transfer, the comparator is disabled, but if applicable, a new identifier may be loaded. In similar way, longer addresses are feasible through multiple byte address loading. The comparison that would upon equality produce a reset signal has been indicated along the equality wire—this could in consequence be multiple. The functionality of nucleus 66 is not described further, its character does not pertain to the invention proper.

I claim:

1. A communication bus system comprising
   one master station;
   a plurality of slave stations;
   a clock signal wire for communicating clock signals from the master station to the slave stations;
   an information bit group signal wire for bidirectionally communicating information bit group signals between the master station and the slave stations;
   a mode indication signal wire for communicating mode indication signals from the master station to the slave stations, the mode indication signals indicating whether a current information bit group is address or data information, address information bit group information including control bits next to operational address bits;
   interface means within the master station for interfacing between the master station and the wires;
   a plurality of respective interface means, one within each of the slave stations, for causing each slave station to recognize
      at least one particular respective address as that slave station's own address, respective values of said control bits as mandating a subsequent data transfer direction with respect to an addressed one of the slave stations, one particular operational address as an interface reset control signal.

2. A system as claimed in claim 1, wherein said address bit group information comprises a system address bit subgroup as distinct from a device address bit subgroup.

3. A system as claimed in claim 1, wherein the stations execute an address programming mode through transfer of a secondary address identification code.

4. A system as claimed in claim 1, and being arranged for through said interface reset control signal freeing said bus for thereby accommodating execution of a different and incompatible bus protocol.

5. A system as claimed in claim 1, wherein in an address information bit group at least one bit signals that a subsequent information bit group contains supplemental address information.

6. System of claim 1 wherein said mode information signals have a first value for indicating address information and a second value for indicating data information; the master station drives the mode indication signals to the first value for signalling a "halt" mode.

7. The system of claim 1 further comprising a second mode indication signal wire and wherein
   the slave stations comprise first and second slave stations having identical addresses;
   the master station sends mode indication signals to the first slave station via the mode indication signal wire and to the second slave station via the second mode indication signal wire.

8. A master station for use in a communication bus system that also includes a plurality of slave stations, comprising
   first bus wire attachment means for outputting clock signals,
   second bus wire attachment means for communicating information bit group signals, and
   third bus wire attachment means for outputting mode indication signals, each mode indication signal identifying an actual information bit group as representing either address information or data information, characterized in that
   said second bus wire attachment means are arranged to output a plurality of different addresses including at least one operational address bit for use as an interface reset control signal, and
   said second bus wire attachment means are arranged for within an address bit group, inserting at least two control bits for, with respective values thereof, mandating a subsequent data transfer direction with respect to an addressed slave.

9. A master station as claimed in claim 8 and having "halt" control means connected to said third bus wire attachment means for through its address information identifying value of said indication signals signalling a "halt" mode.

10. A slave station for use in a communication bus system that also includes a master station and at least one other similar slave station, the slave station comprising
    first bus wire attachment means for receiving clock signals,
    second bus wire attachment means for communicating information bit group signals, and
    third bus wire attachment means for
       receiving mode indication signals and
       through a value of such mode indication signals, discriminating an actual bit group received as representing either address information or data information,
    said second bus wire attachment means being responsive to said discriminating for, when said third bus wire attachment means discriminates address information:
       recognizing at least one particular respective address as its own address; and
       within an address information representing bit group, recognizing respective values of non-address control bits as mandating a subsequent data transfer direction with respect to said second bus wire attachment means.

11. A slave station as claimed in claim 10, wherein said second bus wire attachment means are responsive to receiving address information and in particular a secondary address identification code for subsequently driving said slave station in an address programming mode.

12. A slave station as claimed in claim 10, wherein said third bus wire attachment means are responsive to said address identifying value for, under absence of clock pulses on said fourth bus wire attachment means, driving the slave station in question to a "halt" mode.

13. A slave station as claimed in claim 10, and arranged for operational address programmability, wherein said fifth bus wire attachment means are arranged for recognizing at least a first content of said control bits for subsequently executing an interface reset, and at least a second content of said control bits for thereupon activating an extended addressing operation.

* * * * *